(12) United States Patent
Iwanaga

(10) Patent No.: US 7,887,197 B2
(45) Date of Patent: Feb. 15, 2011

(54) LIGHT SOURCE UNIT AND PROJECTOR WITH LIGHT SOURCE APPARATUS

(75) Inventor: Masakuni Iwanaga, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 1059 days.

(21) Appl. No.: 11/656,658

(22) Filed: Jan. 23, 2007

(65) Prior Publication Data

US 2007/0176187 A1   Aug. 2, 2007

(30) Foreign Application Priority Data

Jan. 27, 2006   (JP) .............................. 2006-018428

(51) Int. Cl.
- G03B 21/26   (2006.01)
- G03B 21/20   (2006.01)
- G02B 3/02   (2006.01)
- G02B 3/06   (2006.01)
- G02B 13/18   (2006.01)
- F21V 5/00   (2006.01)

(52) U.S. Cl. .................... 353/94; 353/100; 353/102; 359/709; 359/711; 362/327

(58) Field of Classification Search ................. 353/94, 353/100, 102; 359/709, 711; 362/327, 555
See application file for complete search history.

(56) References Cited

U.S. PATENT DOCUMENTS 6,724,543 B1 * 4/2004 Chinniah et al. ............ 359/718
7,329,029 B2 * 2/2008 Chaves et al. ............... 362/329
2004/0207999 A1 * 10/2004 Suehiro et al. ................ 362/84
2006/0132725 A1 * 6/2006 Terada et al. ................ 353/102

FOREIGN PATENT DOCUMENTS

| JP | 63-133684 A | 6/1988 |
| JP | 05-063239 A | 3/1993 |
| JP | 2002-040299 A | 2/2002 |
| JP | 2004-220015 A | 8/2004 |
| JP | 2005-079371 A | 3/2005 |
| JP | 2005-228695 A | 8/2005 |
| JP | 2005-229082 A | 8/2005 |
| JP | 2005-268166 A | 9/2005 |

OTHER PUBLICATIONS

Japanese Office Action dated Mar. 3, 2009 and English translation thereof issued in a counterpart Japanese Application No. 2006-018428.

* cited by examiner

*Primary Examiner*—Georgia Y Epps
*Assistant Examiner*—Magda Cruz
(74) *Attorney, Agent, or Firm*—Holtz, Holtz, Goodman & Chick, PC

(57) ABSTRACT

A light source unit includes a light emitting element, a substrate on which the light emitting surface is disposed, a sealing portion which transmits light from the light emitting surface, and a collimator lens having an inverted truncated hexagonal pyramid shape for forming light emitted from the sealing portion into a bundle of parallel rays of light, the sealing portion having two or more convexly curved surfaces which project in a direction in which light is emitted therefrom.

6 Claims, 11 Drawing Sheets

LIGHT SOURCE UNIT AND PROJECTOR WITH LIGHT SOURCE APPARATUS

BACKGROUND OF THE INVENTION

1. Field of the Invention

The present invention relates to a light source unit, a light source apparatus utilizing the light source unit, and a projector utilizing the light source apparatus.

2. Description of the Related Art

Currently, high-luminance ultra-high pressure mercury lamps and metal halide lamps are used much as light sources of data projectors. However, since they have a large heating value, these light emitting elements have had a drawback that a cooling mechanism becomes complicated in construction and large in size. Because of this, small projector light sources have been proposed which utilize light emitting diodes or the like whose heating value is relatively small. For example, the Japanese Unexamined Patent Publication No. 2004-220015 proposes a projector which utilizes a light source in which light emitting elements such as light emitting diodes or the like are arranged in an array or arrays.

Light sources unit of this type are used much in which light emitting diodes are used as light emitting elements which are arranged into arrays, the light emitting elements are mounted on a substrate, the light source unit is covered with a dome-shaped sealing portion, and light that is emitted from the light emitting elements and which is allowed to pass through the sealing portion is made into a bundle of parallel rays of light by a collimator lens which is formed externally into the shape of paraboloid of revolution or ellipsoid of revolution so as to be emitted to the outside.

With the light source unit that has been described above, however, since the collimator lens which is formed externally into the shape of paraboloid of revolution, the external shape of the collimator lens becomes large, resulting in a problem that a plurality of light emitting elements cannot be arranged highly densely.

The prevent invention was made in view of the problem inherent in the related art, and an object thereof is to provide a light source unit which can be arranged highly densely, a light source apparatus which utilizes the light source unit, and a projector which utilizes the light source apparatus.

SUMMARY OF THE INVENTION

According to a preferred aspect of the invention, there is provided a light source unit including a light emitting element, a substrate on which the light emitting element is disposed, a sealing portion which transmits light of the light emitting element and a collimator lens for forming light emitted from the sealing portion into a bundle of parallel rays of light for emission therefrom, wherein each of the sealing portions has two or more convexly curved surfaces which project in a direction in which light is emitted therefrom, wherein the collimator lens has an inverted truncated hexagonal pyramid shape, and wherein a light emitting surface of the collimator lens comprises a flat surface portion which is formed at a center thereof in such a manner as to be parallel to a bottom surface of the collimator lens, and an inclined surface formed around a perimeter of the flat surface portion, whereby the collimator lens comprises an inverted truncated hexagonal cone-shaped top portion which is recessed at a center thereof.

In addition, according to another preferred aspect of the invention, there is provided a light source apparatus including a plurality of light source units which are disposed adjacent to each other, each of the plurality of light source units including a light emitting element, a substrate on which the light emitting element is disposed, a sealing portion which transmits light of the light emitting element, and a collimator lens which forms light emitted from the sealing portion into a bundle of parallel rays of light for emission therefrom, wherein each of the sealing portions has two or more convexly curved surfaces which project in a direction in which light is emitted therefrom, wherein the collimator lens is formed into an inverted truncated hexagonal pyramid shape, and wherein a light emitting surface of the collimator lens comprises a flat surface portion which is formed at a center thereof in such a manner as to be parallel to a bottom surface of the collimator lens, and an inclined surface formed around a perimeter of the flat surface portion, whereby the collimator lens comprises an inverted truncated hexagonal cone-shaped top portion which is recessed at a center thereof.

DETAILED DESCRIPTION OF THE PREFERRED EMBODIMENTS

Figure 1:
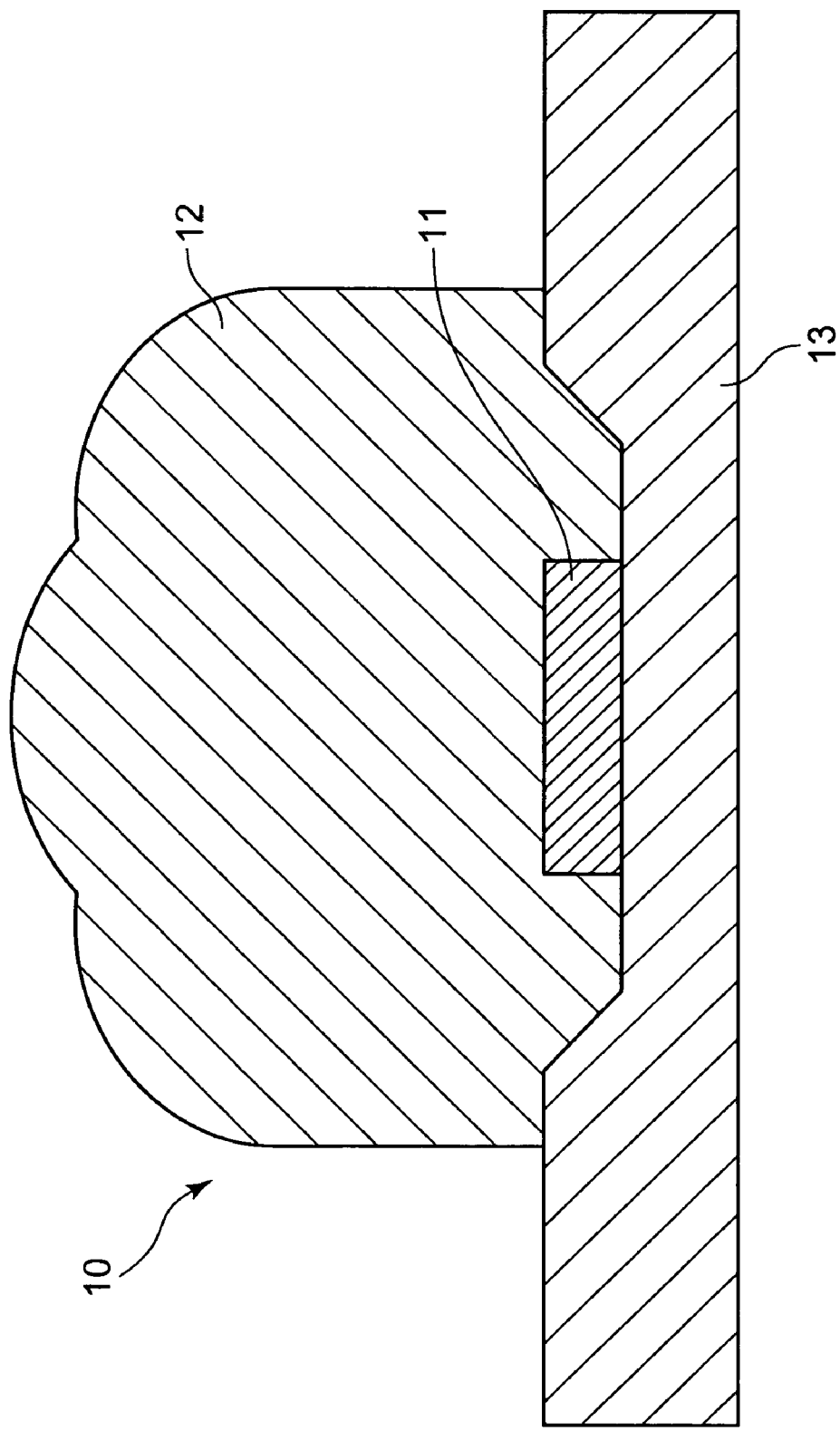
[FIG. 1] A sectional view of a sealing portion of an embodiment of the invention.

Hereinafter, embodiments of the invention will be described in detail. A light source unit 10 of the invention includes, as is shown in FIG. 1, a light emitting element 11 such as a light emitting diode, a substrate 13 on which the light emitting element 11 is mounted, a sealing portion 12 having a convexly curved surface which is placed to cover the light emitting element 11, and, as is shown in FIG. 2, a collimator lens 21 which forms light emitted from the light emitting element 11 and passed through the sealing portion 12 into a bundle of parallel rays of light.

This sealing portion 12 is made of a transparent resin and is formed into a body of revolution having two curved surfaces which project in a direction in which light is emitted from the sealing portion 12, and these two curved surfaces are made up of a central convexly spherical surface portion which is formed into an arc-shaped spherical surface which is caused to project at the center thereof and a peripheral convexly curved surface portion which is formed into an arc-shaped spherical surface which is formed, in turn, into a doughnut or ring shape which covers the periphery of the central spherical surface portion and which has its center of curvature on a light emitting element side. Then, in this sealing portion 12, light emitted from the light emitting element is made into a bundle of parallel rays of light which is centered on a rotational axis by the central spherical surface portion while being formed into a bundle of rays of light which spreads into an annular shape with a constant width by the peripheral curved surface portion which covers the periphery of the central spherical surface portion, whereby the sealing portion 12 divides the light emitted from the light emitting element 11 into the cylindrical bundle of rays of light which is centered on the rotational axis and the bundle of rays of light which is formed into the annular shape around the periphery of the cylindrical bundle of rays of light for emission to the collimator lens 21.

Figure 2:
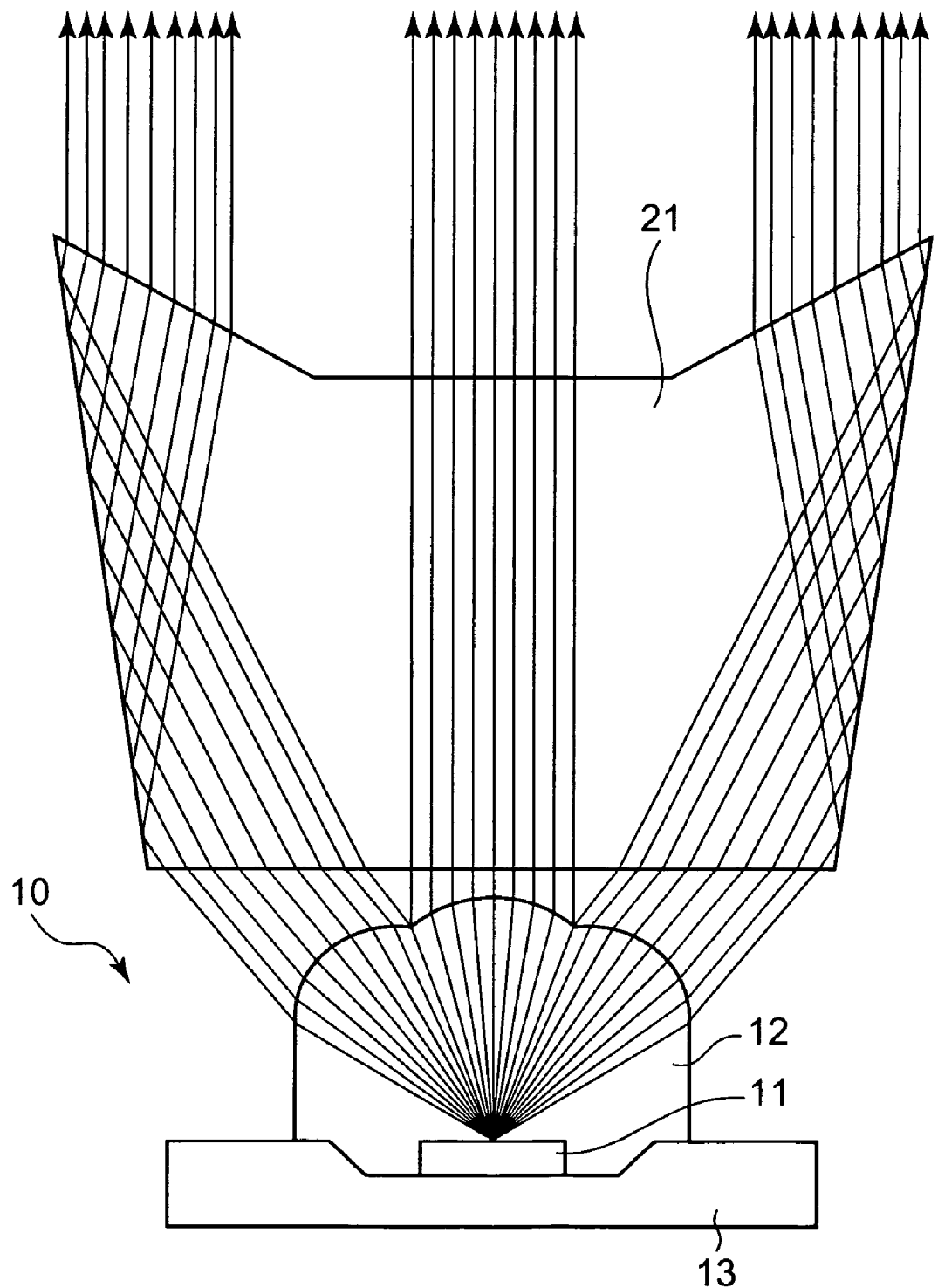
[FIG. 2] A sectional view of a light source unit of the embodiment of the invention.

The collimator lens 21 is disposed on an optical axis of light emitted from the sealing portion 12, and as is shown in FIG. 2, a main body of the collimator lens 21 is formed into an inverted truncated cone shape. A flat surface portion is formed at a central part of a light emitting surface of the collimator lens 21 in such a manner as to become parallel to a bottom surface of the main body thereof and an inclined surface is formed in such a manner as to surround the perimeter of the flat surface portion, whereby the light emitting surface of the collimator lens 21 is formed into an inverted truncated cone-shaped top portion which is recessed at the center. Then, the bundle of rays of light which is emitted from the central spherical surface of the sealing portion 12 enters the collimator lens 21 from the bottom surface thereof and exits through the flat surface portion, while the bundle of rays of light which is emitted from the peripheral curved surface portion of the sealing portion 12 enters the collimator lens 21 from the bottom surface thereof, are reflected on a surrounding side surface and thereafter are refracted on the inclined surface for emission from the collimator lens 21. The bundles of rays of light which are emitted from the collimator lens 21 are formed into bundles of parallel rays of light which are substantially parallel to a center line of the sealing portion 12 and the collimator lens 21.

The substrate 13 is a plate on which the light emitting element 11 is to be placed and has on a surface thereof a recessed portion formed into an inverted truncated cone-shape on which the light emitting element 11 is to be placed. This substrate 13 has a function to dissipate heat generated by the light emitting element 11 to the outside and is molded of a heat conductive material.

By forming the two convexly curved surfaces in such a manner as to project in the direction in which light is emitted from the sealing portion 12 in this way, light emitted from the sealing portion 12 can be restricted more with respect to the range of bundles of rays of light which are emitted to the outside than a conventional dome-shaped sealing portion. Then, since the range of bundles of rays of light which are emitted from the sealing portion 12 to the outside can be restricted, the bottom surface of the collimator lens 21, which forms light emitted from the sealing portion 12 into bundles of parallel rays of light, can be made smaller in size.

In addition, by forming the collimator lens 21 into the body having the inverted truncated cone-shaped top portion, although in a conventional collimator lens, bundles of parallel rays of light are emitted by forming its outer circumferential configuration into a parabolic surface shape, in the collimator lens 21 of this embodiment, even though its outer circumferential configuration is formed into the conical surface shape which is formed by straight lines, bundles of parallel rays of light can be emitted therefrom.

Figure 3:
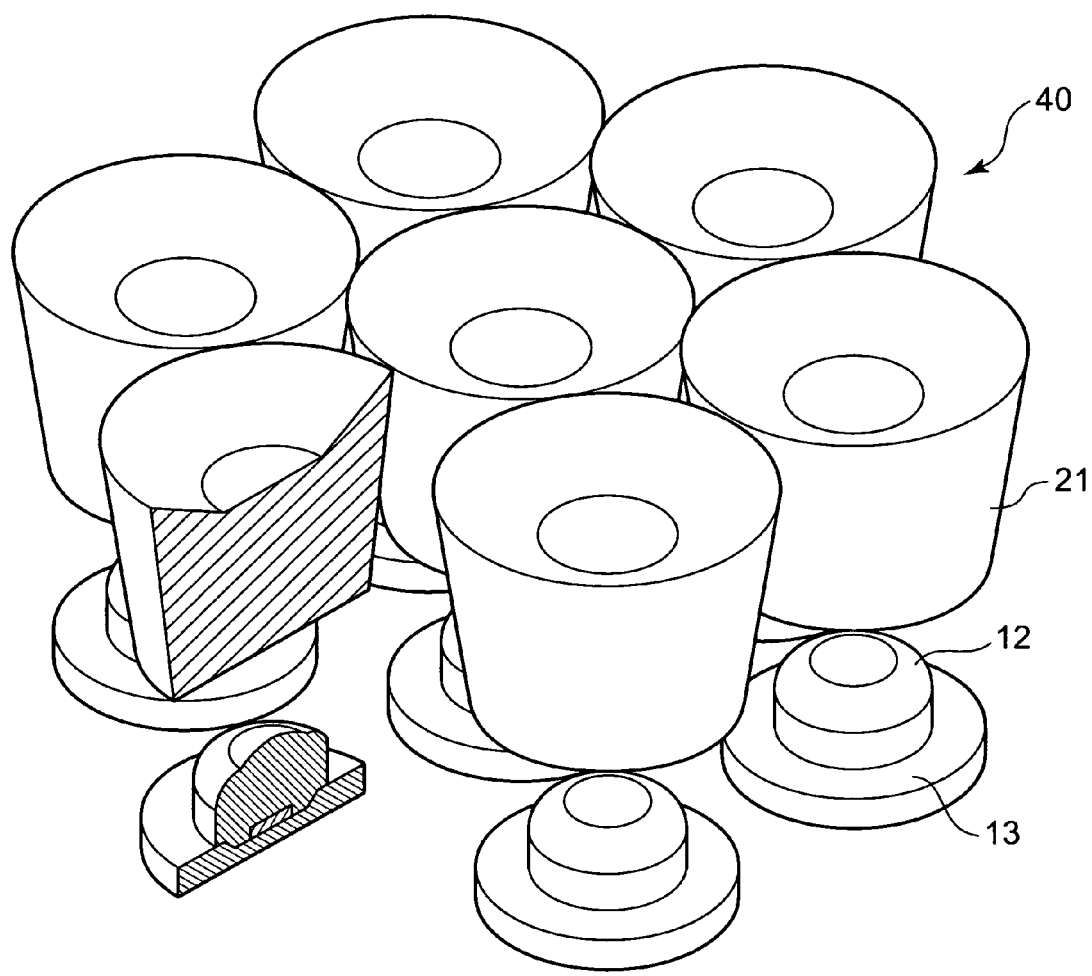
[FIG. 3] A perspective view of a light source apparatus of the embodiment of the invention.

Then, by forming the outer circumferential configuration of the collimator lens 21 into the conical surface shape which is formed by straight lines in this way, in contrast to the fact that since the conventional collimator lens was such that its outer circumferential configuration was formed into the parabolic surface shape, a plurality of light source units 10 could not be arranged closely to each other so that they were able to be packed highly densely, in this embodiment, as is shown in FIG. 3, a plurality of light source units 10 whose maximum diameter is reduced can be arranged closely to each other so that they are able to be packed highly densely, whereby a light source apparatus 40 which can emit light of high luminance can be provided by arranging a plurality of light source units 10 so closely to each other.

Note that when a light emitting diode is used as the light emitting element 11, although it is, of course, possible to use a white light emitting diode, the light emitting diode so used is not limited to the white light emitting diode, and hence, a configuration can also be adopted in which a plurality of light source units 10 which include colored light emitting diodes such as a red light emitting diode, a green light emitting diode and a blue light emitting diode are arranged closely to each other.

Figure 4:
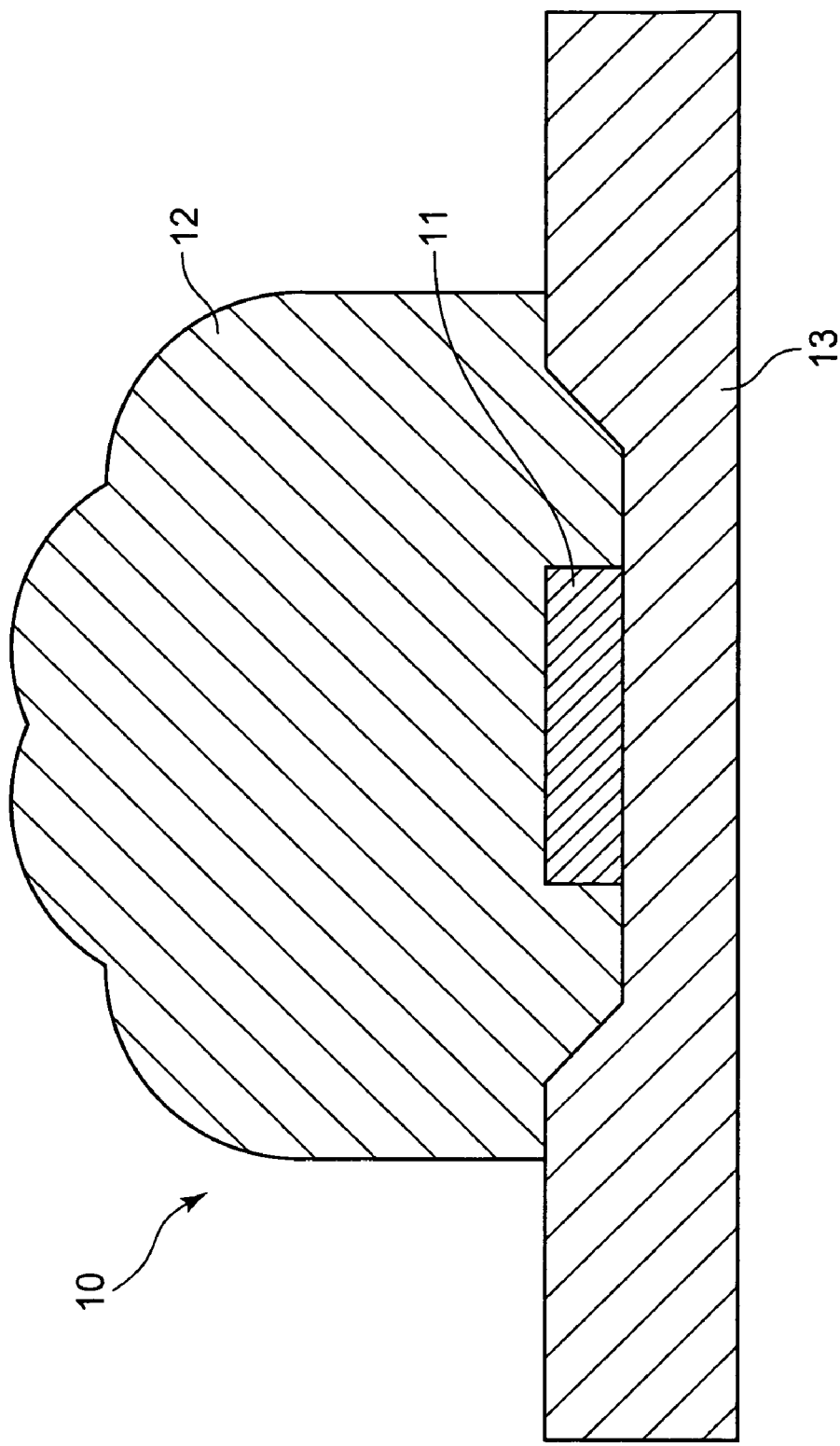
[FIG. 4] A sectional view of a sealing portion of another embodiment of the invention.

In addition, a sealing portion 12 of a light source unit 10 of another embodiment of the invention is made of a transparent resin and is formed, as is shown in FIG. 4, into a body of revolution which has two convexly curved surfaces. This sealing portion 12 has a doughnut- or ring-shaped central annular curved surface portion which is positioned around a center axis of the body of revolution and which has its center of curvature on a light emitting element 11 side and a doughnut- or ring-shaped peripheral curved surface portion which covers the periphery of the central annular curved surface portion and has its center of curvature on the light emitting element 11 side. The sealing portion 12 so configured divides light from a light emitting element 11 into two large and small annular bundles of rays of light by the central annular curved surface portion and the peripheral curved surface portion for emission towards a collimator lens 21.

Figure 5:
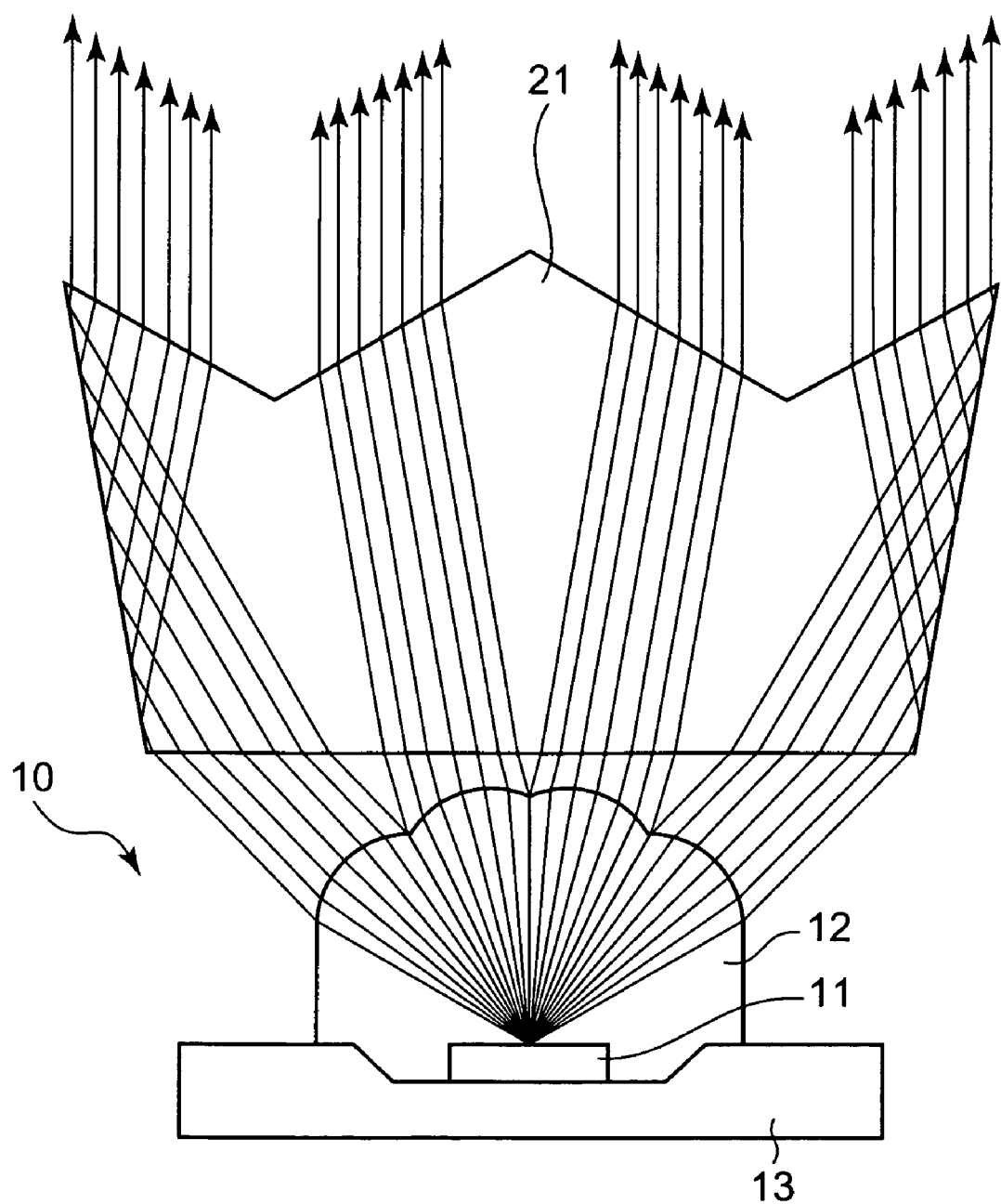
[FIG. 5] A sectional view of a light source unit of the embodiment of the invention.

The collimator lens 21 is disposed on an optical axis of light emitted from the sealing portion 12, and as is shown in FIG. 5, a main body of the collimator lens 21 is formed into an inverted truncated cone shape. In addition, a top portion of the collimator lens 21 is made up of a central inclined surface which is formed into a cone shape so that a projecting portion is formed at the center thereof and a side inclined surface which constitutes a surface which is inclined from a circumferential edge of a bottom portion of the central inclined surface towards a circumferential edge of the collimator lens 21. Because of this, a bundle of rays of light which is emitted from the central annular curved surface of the sealing portion 12 enters a bottom surfaced of the collimator lens 21 and is then emitted from the central inclined surface in such a manner as to be refracted thereat. In addition, a bundle of rays of light which is emitted from the peripheral curved surface portion of the sealing portion 12 enters the bottom surface of the collimator lens 21 and is then emitted from the side inclined surface in such a manner as to be refracted thereat after the bundle of rays of light is reflected on a peripheral side surface of the collimator lens 21. The bundles of rays of light which are emitted from the central inclined surface and the side inclined surface are formed into bundles of parallel rays of light which are substantially parallel to a center line of the collimator lens 21.

By forming the two convexly curved surfaces in a direction in which light is emitted from the sealing portion 12 in this way, light emitted from the sealing portion 12 can be formed into two ring-shaped bundles of rays of light which are restricted more with respect to a range of bundle of rays of light which is emitted to the outside than the related art in which the sealing portion is formed into a dome shape. Thus, since the range of bundles of rays of light emitted from the sealing portion 12 to the outside can be restricted, the bottom surface of the collimator lens 21 which converts light emitted from the sealing portion 12 into bundles of parallel rays of light can be made smaller in size.

In addition, by providing the central inclined surface and the side inclined surface at the top portion of the collimator lens 21, although in the conventional collimator lens, bundles of parallel rays of light are emitted by forming its outer circumferential configuration into a parabolic surface shape, in the collimator lens 21 of this embodiment, bundles of parallel rays of light can be emitted even though its outer circumferential configuration is formed into the conical surface shape which is formed by straight lines.

Figure 6:
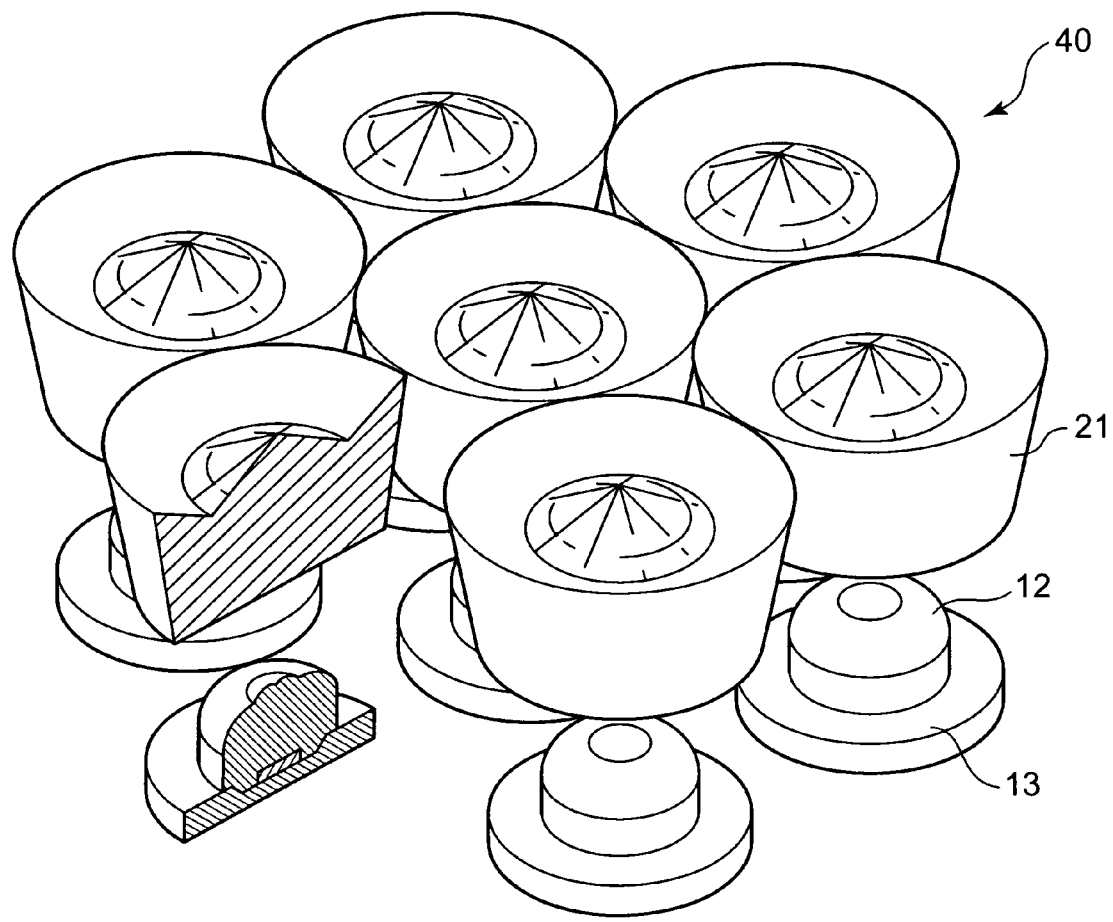
[FIG. 6] A perspective view of a light source apparatus of the embodiment of the invention.

Then, by forming the outer circumferential configuration of the collimator lens 21 into the conical surface shape which is formed by straight lines in this way, in contrast to the fact that since the conventional collimator lens was such that its outer circumferential configuration was formed into the parabolic surface shape, a plurality of light source units 10 could not be arranged closely to each other so that they were able to be packed highly densely, in this embodiment, as is shown in FIG. 6, a plurality of light source units 10 can be arranged closely to each other so that the plurality of light source units 10 are able to be packed highly densely, whereby a light source apparatus 40 which can emit light of high luminance can be provided.

Note that also in this light source apparatus 40 in which the plurality of light source units 10 are arranged adjacent to each other, when a light emitting diode is used as the light emitting element 11, although it is, of course, possible to use a white light emitting diode, the light emitting diode so used is not limited to the white light emitting diode, and hence, a configuration can also be adopted in which a plurality of light source units 10 which include colored light emitting diodes such as a red light emitting diode, a green light emitting diode and a blue light emitting diode are arranged closely to each other.

Figure 7:
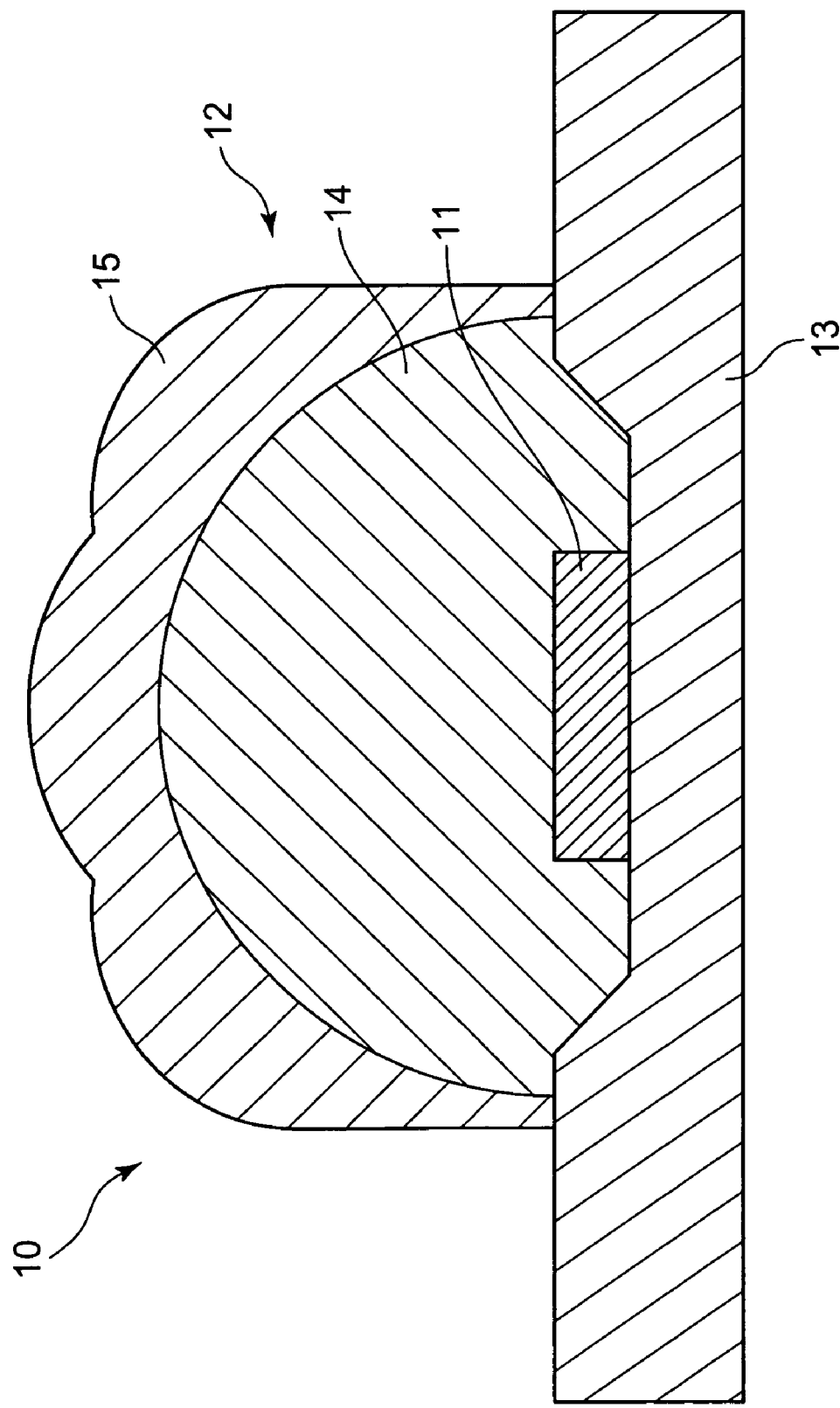
[FIG. 7] A sectional view of a sealing portion of a further embodiment of the invention.

In addition, a sealing portion 12 of a light source unit 10 of a further embodiment of the invention is made of a transparent resin or the like, and as is shown in FIG. 7, the sealing portion 12 is made up of a dome-shaped sealing material 14 and a lens cap 15 having a convexly curved surface. This lens cap 15 is formed into the shape of a body of revolution having two convexly curved surfaces which are made to project in a direction in which light is emitted therefrom and has an opening portion in a bottom portion thereof which is adapted to accommodate therein the sealing portion 12. Additionally, the lens cap 15 is optically bonded to the sealing material 14. Then, as with the embodiment shown in FIG. 2, light from a light source unit 11 is divided into a cylindrical bundle of parallel rays of light which is centered on a center axis of the sealing portion 12 and a bundle of rays of light which spreads in an annular fashion for transmission to a collimator lens 21.

Figure 8:
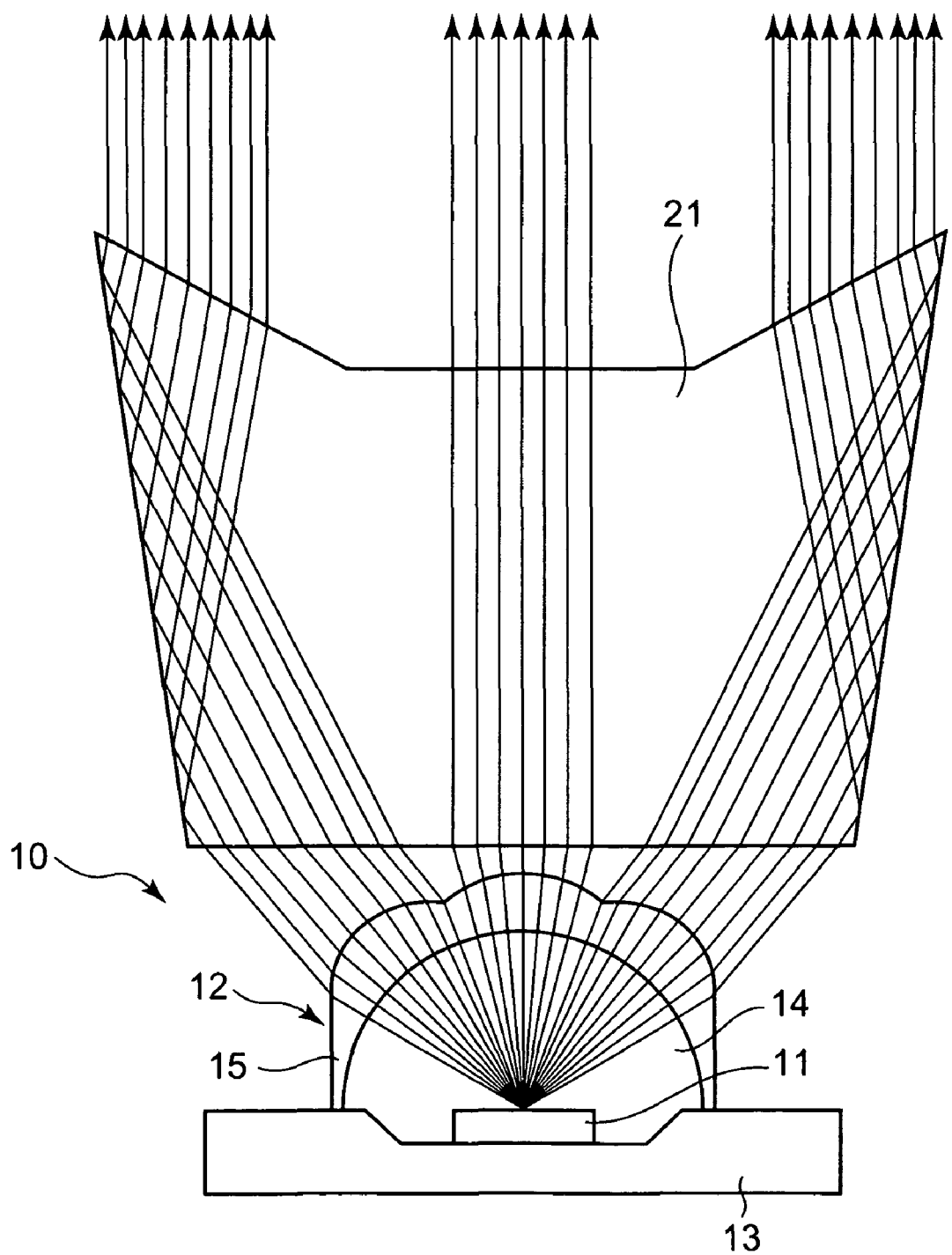
[FIG. 8] A sectional view of a light source unit of the further embodiment of the invention.

The collimator lens 21 is disposed on an optical axis of light emitted from the sealing portion 12 and is, as is shown in FIG. 8, formed into an inverted truncated cone shape. A light emitting surface thereof is configured to have at a center thereof a flat surface portion which is made parallel to a bottom surface of the collimator lens 21 and an inclined surface which is formed around the perimeter of the flat surface portion, whereby the collimator lens 21 has an inverted truncated cone-shaped top portion which is recessed at a center thereof. Consequently, a bundle of rays of light which is emitted from the central curved surface portion of the sealing portion 12 enters the bottom surface of the collimator lens 21 and is emitted from the flat surface portion, whereas a bundle of rays of light which is emitted from the peripheral curved surface portion enters the bottom surface of the collimator lens 21 and is then emitted from the inclined surface, whereby the bundles of rays of light which are emitted from the collimator lens 21 are made to become bundles of parallel rays of light which are substantially parallel to the center line of the sealing portion 12 and the collimator lens 21.

By using the lens cap 15 that is configured as has been described above, only through the optical bonding of the lens cap 15 to the dome-shaped sealing material 14, the light from the light emitting element 11 can be divided into the plurality of bundles of rays of light. In addition, by dividing the light from the light emitting element 11 into two bundles of rays of light such as the cylindrical bundle of rays of light and the annular bundle of rays of light in this way, the range of bundles of rays of light which are emitted from the sealing portion 12 to the outside can be restricted. Furthermore, since the range of bundles of rays of light which are emitted from the sealing portion 12 can be restricted, the bottom surface of the collimator lens 21 which converts light emitted from the sealing portion 12 into bundles of parallel rays of light can be made smaller in size.

Note that the shape of the lens cap 15 is not limited to the shape that has been described above, and hence, there may occur a case where the lens cap 15 is formed into the shape of the sealing portion 12 shown in FIG. 5 which has the annular central curved surface portion and the peripheral curved surface portion, and furthermore, the lens cap 15 may be formed into any shape, provided that the shape can allow light emitted from the light emitting element 11 to be divided into a plurality of bundles of rays of light which eventually converge on to the bottom surface of the collimator lens 21.

Figure 9:
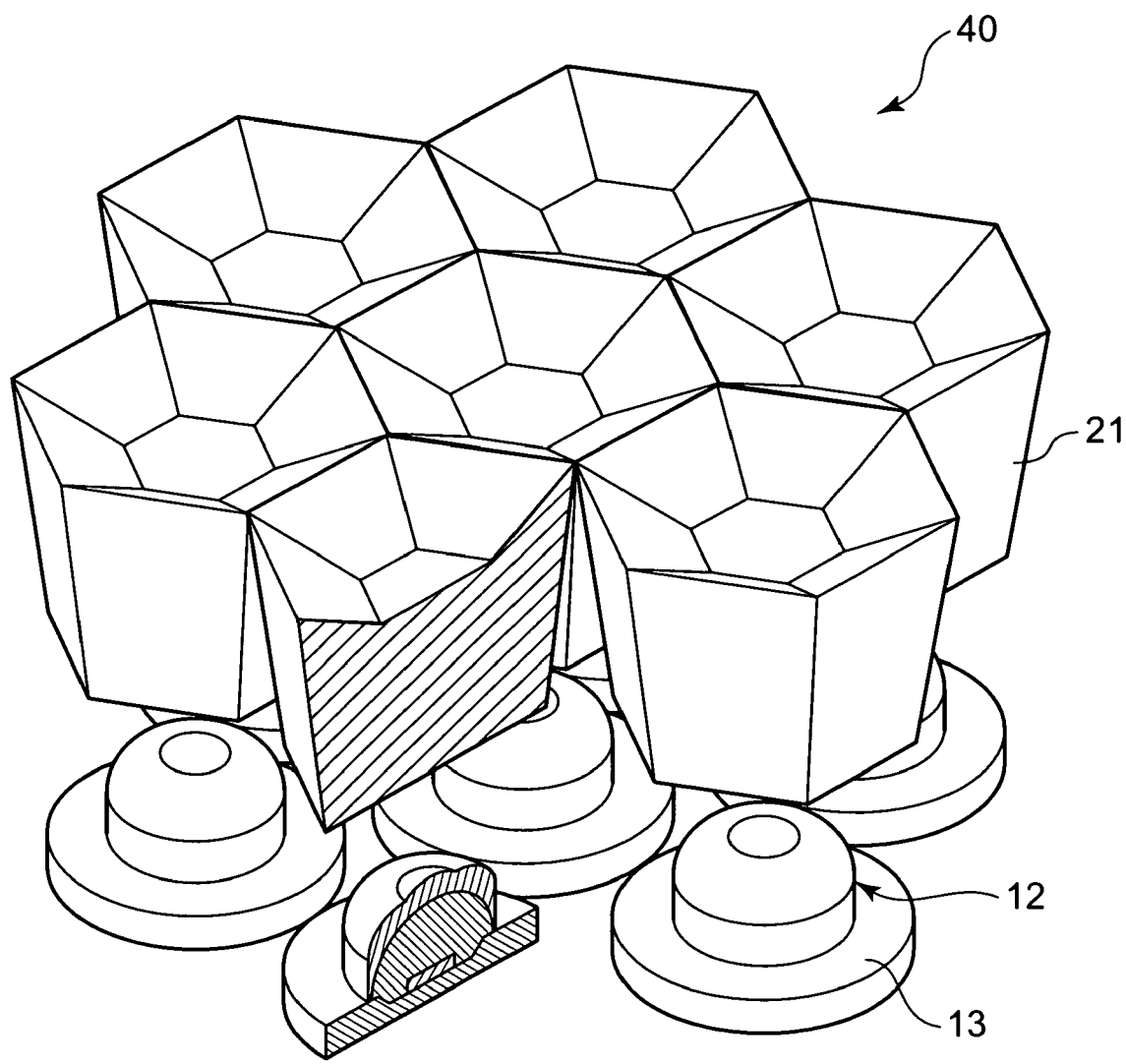
[FIG. 9] A perspective view of a light source apparatus of the further embodiment of the invention.

In addition, a collimator lens 21 which is to be used in a light source unit 10 according to another embodiment of the invention may be, as is shown in FIG. 9, formed into an inverted truncated hexagonal pyramid shape, and a light emitting surface thereof may configured such that a flat surface portion is formed at a center thereof in such a manner as to be parallel to a bottom surface of the collimator lens 21 and an inclined surface is formed around the perimeter of the flat surface portion, whereby the collimator lens 21 is made to have a top portion which is formed into an inverted truncated hexagonal pyramid shape which is contracted at a center thereof. By using the collimator lens 21 that is configured like this, in the event that a light source apparatus 40 is made up of a plurality of light source units 10 which are arranged closely to each other, since with the light source unit whose outer circumferential configuration is formed into the hexagonal pyramid shape the light source units can be provided closely to each other side by side with smaller gaps provided therebetween than with the light source unit whose outer circumferential configuration is formed into the conical surface, a plurality of light source units 10 can be arranged closely to each other so that the light source units 10 can be positioned side by side highly densely.

In addition, in the event that the collimator lens 21 whose main body is formed into the inverted truncated hexagonal pyramid shape in this way, by using a sealing portion 12 in which a central curved surface is formed at a top portion of the sealing portion and six convex lenses whose light emitting side surface is made convex are additionally provided around the perimeter of the central curved surface, a configuration may also be adopted in which emitted light which is converted into a cylindrical bundle of parallel rays of light is shone on to each of six circumferential sides of the collimator lens 21 which is formed into the hexagonal shape by each of the convex lenses so provided so as to be reflected on an interior surface of the collimator lens 21, whereby light so reflected on the respective interior surfaces of the collimator lens 21 is emitted from the light emitting surface of the collimator lens 21 as a bundle of parallel rays of light which are parallel to the center line thereof, whereas light from the central curved surface at the top portion of the sealing portion 12 is emitted from the central flat portion of the collimator lens 21 as a bundle of parallel rays of light which are parallel to the center line thereof.

The configuration of the sealing portion does not necessarily have to be limited to those described heretofore in the embodiments, and since the sealing portion 12 may only have to be such as to divide light from the light emitting element 11 into a plurality of bundles of rays of light so that the bundles of rays of light so divided eventually collect on to the bottom surface of the collimator lens 21, any configuration can be adopted for the sealing portion 12 provided that the configuration has two or more curved surfaces, and therefore, there is no specific limitation on the number of curved surfaces provided.

Figure 10:
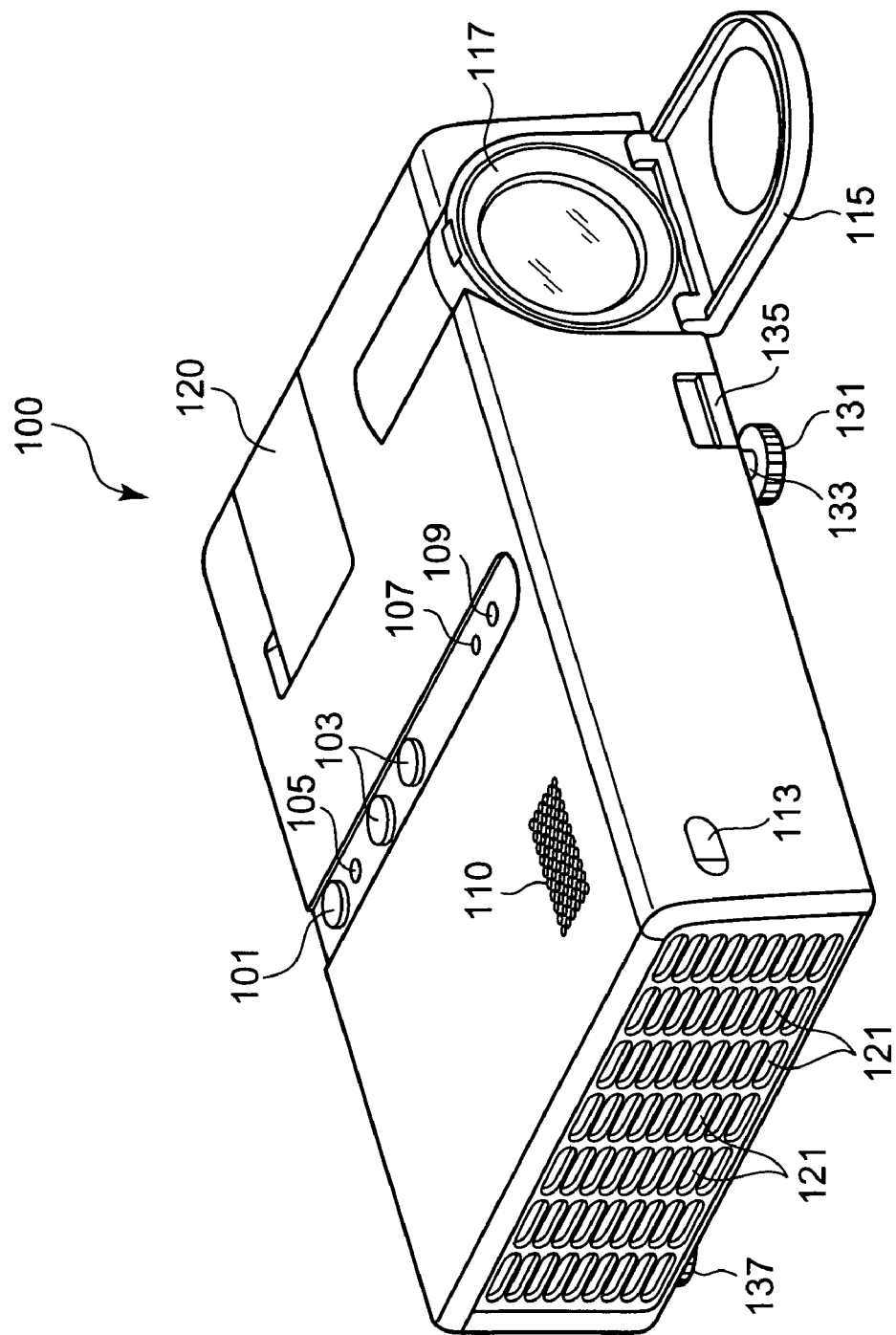
[FIG. 10] A perspective view of a projector of an embodiment of the invention.

Next, a projector will be described which utilizes the light source unit 10 that has been described above. As is shown in FIG. 10, a projector 100 of an embodiment of the invention is formed substantially into a parallelepiped shape, and a lamp indicator 109, a heating indicator 107, a stand-by indicator 105 which is lit when a power supply key 101 or a power supply is switched on, image quality adjusting keys 103 for implementing automatic image quality adjustment and manual image quality adjustment and a speaker opening 110, and furthermore, a cover of a key box which incorporates therein various adjusting keys are provided on an upper panel of the projector 100.

On a front panel of the projector 100, a projection opening 117 is provided inside a lens cover 115 which is made to be opened and closed, and a remote control signal receiving unit 113 is formed which is adapted to receive an infrared signal from a remote controller for remotely controlling the projector 100. On a side panel of the projector 100, exhaust vents 121 are provided, and an exhaust fan 125 is incorporated inside the side panel.

In addition, a rear leg 137 is provided near each of rear lengthwise ends of a bottom panel of the projector 100, and a front leg 131 is provided at a center of a front edge portion of the bottom panel which is adapted to adjust the height of a body of the projector 100 by means of a rod, a locking key 135 being also provided on a front panel which locks the front leg 131 at a certain predetermined height.

Figure 11:
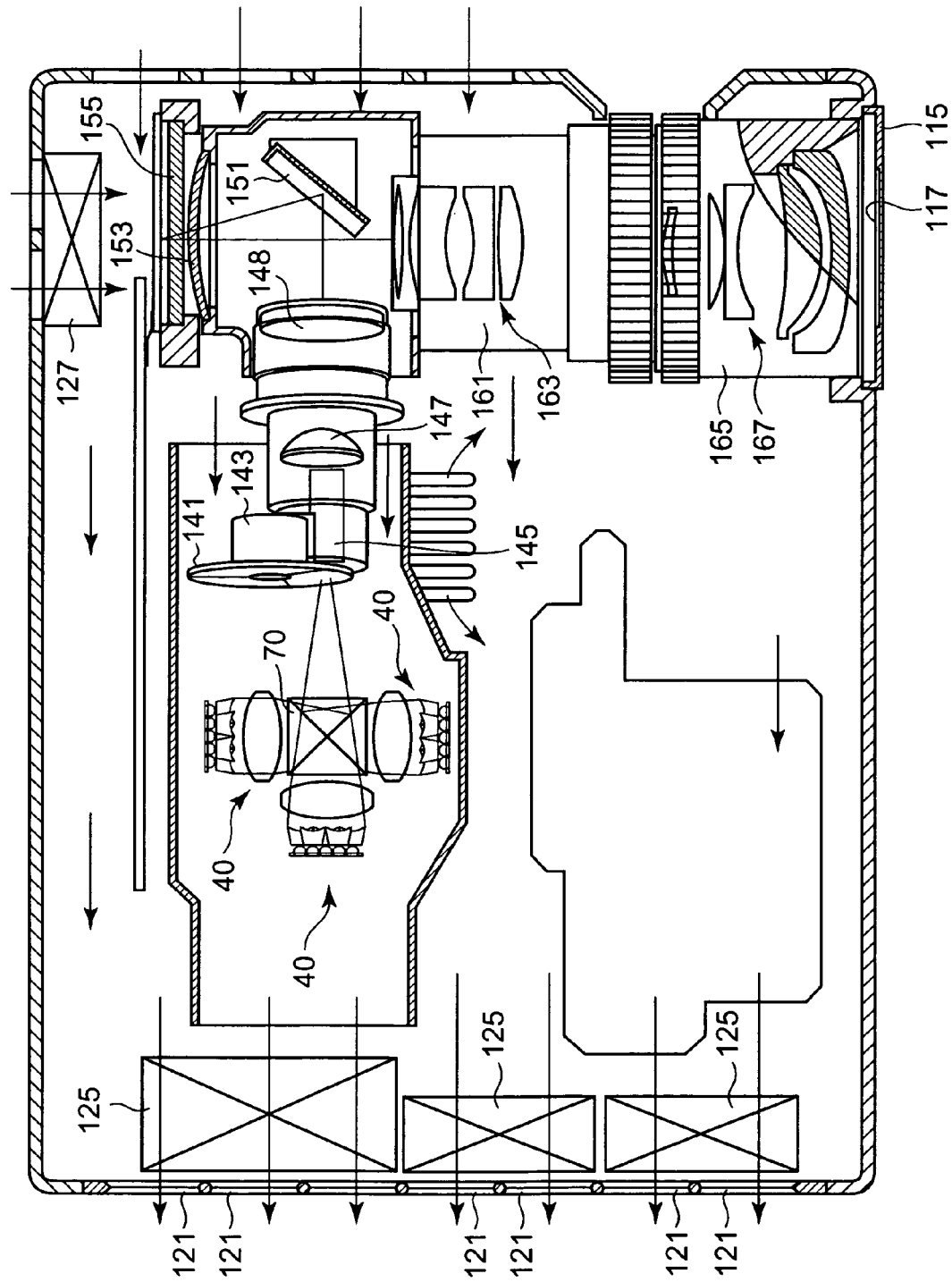
[FIG. 11] An explanatory view of an interior of the projector of the embodiment of the invention.

As is shown in FIG. 11, three light source apparatuses 40 are disposed in such a manner as to surround circumferentially a dichroic prism 70 on three sides thereof at intervals of 90 degrees while being spaced equidistantly apart from the dichroic prism 70. By disposing the light source apparatuses 40 in this way, light from those tree light source apparatuses 40 can be superposed on each other at the dichroic prism 70.

In addition, as to light emitting diodes which are used in the individual light source apparatuses 40, colored diodes such as a red light emitting diode, a green light emitting diode and a blue light emitting diode are used in each of the light source apparatuses 40. In addition to this configuration, each of the individual light source apparatuses 40 can be made up of only red light emitting diodes, green light emitting diodes or blue light emitting diodes. Even though the light source apparatuses 40 are so made up, white light can be emitted by superposing red, green and blue light rays from the respective light source apparatuses 40 by the dichroic prism 70.

Additionally, a light source side optical system in which optical axes of the three light source apparatuses 40 are made to coincide with each other in such a way that light from the light source apparatuses 40 can be superposed on each other at the dichroic prism 70 so that light emitted from the dichroic prism 70 is made to enter a display device 155 is made up of a color wheel 141 which colors sequentially light emitted from the light source apparatuses 40 in three colors such as red, green and blue, a light guiding rod 145 for making uniform the intensity distribution of light emitted from the light source apparatuses 40, and a plurality of light source side lenses 147, 148 and one mirror 151 which function to project light which has been colored by the color wheel 141 and whose intensity distribution has been made uniform by the light guiding rod 145 towards a front surface of the display device 155.

This color wheel 141 is made up of a rotating plate on which three color filters of red, green and blue segments are aligned circumferentially and is fixed at a center thereof to a rotational shaft of a color wheel rotating motor 143 which is disposed sideways relative to an optical path of light emitted from the light source apparatuses 40 via the dichroic prism 70 in such a state that a circumferential part of the color wheel is disposed to lie in the optical path of light emitted from the light source apparatuses 40 via the dichroic prism 70.

The light guiding rod 145 guides light which enters it from a light incident surface thereof while reflecting the light that has so entered on a reflecting film on an inner circumferential surface thereof and emits the light from a light emitting surface thereof as light whose light intensity distribution is made uniform. The light guiding rod 45 is disposed in such a manner that the light incident surface thereof faces a light emitting side of the color wheel 141, and since light emitted from the dichroic prism 70 of the light source apparatuses 40 is made to enter the light guiding rod 145 from the light incident surface thereof, the light guiding rod 145 is disposed in such a manner that a rod center axis thereof coincides with an optical axis of the dichroic prism 70.

In addition, the light source side lenses 147, 148 are disposed within a lens supporting barrel which is disposed on a light emitting side of the light guiding rod 145 in such a state that centers of the lenses are made to coincide with an extension of a center axis of the light guiding rod 145 or the optical axis of light emitted from the light source apparatuses 40 via the dichroic prism 70.

The mirror 151 of the light source side optical system is disposed inclined at a predetermined angle relative to the optical axis of light emitted from the light source apparatuses 40 via the dichroic prism 70 so as to reflect light that has been transmitted through the color wheel 141, the light guiding rod 145 and the light source side lenses 147, 148 towards the display device 155, so that the reflected light is projected from a direction which is inclined to one direction relative to a direction of a front of the display device 155.

On the other hand, a cover glass for protecting the display device 155 is disposed in front of the display device 155, and furthermore, and a relay lens 153 is disposed which makes the light projected from the direction which is inclined to the one direction relative to the direction of the front of the display device 155 enter the display device 155 while correcting the light into parallel light parallel to a direction which is inclined at a predetermined direction relative to the direction of the front of the display device 155 and makes image forming light which has been emitted from the display device 155 enter a group of projection system lenses while concentrating the light so emitted.

The display device 155 is a display device 155 which includes no such device as the color filter which colors incident light, and in this embodiment, a micromirror display device 155 is used which is generally designated as a DMD which stands for a digital mircomirror device.

The micromirror display device 155 is such as to display an image by reflecting light which is incident thereon from the incident direction which is inclined to the one direction relative to the direction of the front thereof at an incident angle of a predetermined range in the direction of the front of the device and an inclined direction through switching inclined directions of the plurality of micromirrors, and light incident on the micromirrors which are tilted in one inclined direction is reflected to the direction of the front of the micromirror display device by the micromirrors so tilted, while light incident on the micromirrors which are tilted in the other direction is reflected to the inclined direction by the micromirrors so tilted, whereby an image is displayed by a bright display resulting from the reflection in the direction of the front of the device and a dark display resulting from the reflection in the inclined direction.

The brightness of the bright display can be varied arbitrarily by controlling the time during which the micromirrors are kept inclined in one of the directions (the direction in which the incident light is reflected towards the front of the micromirror display device, and consequently, an image having a gradation in brightness can be displayed by the micromirror display device 155.

In addition, a microcomputer, which functions as a projector control unit, is provided in the projector of this embodiment, and an operation in each circuit within the projector is controlled by this projector control unit. Namely, when the power supply switch is put into an "on" state, the light source apparatuses 40 are lit, and various cooling fans are driven at rated speeds which match the output of the light source apparatuses 40, fan configurations of the various cooling fans and arrangement thereof, so that the projector 100 is put in a stand-by state while drawing in outside air from intake vents provided in a projector casing and discharging inside air from the exhaust vents 121.

The group of projection system lenses is a variable focus lens which includes an incident side fixed lens barrel 161 and an emerging side movable lens barrel 165 which is brought into engagement with the fixed lens barrel 161 and is adapted to be moved back and forth in an axial direction by being operated rotatably with a fixed lens group 163 made up of a combination of a plurality of lens elements and a movable lens group 167 made up of a combination of a plurality of lens elements being provided in the fixed lens barrel 161 and the movable lens barrel 165, respectively.

An opening 169 is provided in a side of the projector casing where the group of projection lenses is provided for implementing focus adjustment by manually rotating the movable lens barrel 165 of the group of projection lenses.

Furthermore, a plurality of intake vents which are each formed into an elongated hole shape are provided in a bottom surface and a side surface of the side of the projector casing where the group of projection lenses is provided for cooling the interior of the projector housing.

This projector 100 is such that light is emitted from the light source apparatuses 40, the light which has been so emitted from the light source apparatuses 40 to enter the light source side optical system is sequentially colored in the three colors such as red, green and blue by the color wheel 141 which is driven to rotate at high speeds, the light so colored is then made uniform with respect to intensity distribution by the light guiding rod 145, and the light whose intensity distribution has been so made uniform is then projected towards the micromirror display device 155 by the light source side lenses 147, 148 and the mirror 151.

The projector 100 then writes sequentially single-colored image data of red, green and blue on to the mircromirror display device 155 in synchronism with projection cycles of rays of red, green and blue light, whereby the single-colored images of red, green and blue are made to be sequentially displayed on the mircromirror display device 155 so that the single-colored image forming light of red, green and blue that is sequentially emitted from the mircromirror display device 155 is enlarged to be projected on to a projection screen by the group of projection system lenses, thus, the single-colored images of the three colors of red, green and blue which have been so projected on to the projection screen being allowed to look as superposed on each other so as to eventually display a full-color image on the projection screen.

This projector 100 is such as to be used by opening the projection lens cover 115 so as to expose a light emitting end of the group of projection system lenses and switching on the power supply key 101, and when the power supply key 101 is switched on, a light emitting element 11 of each light source apparatus 40 is lit, the color wheel 141 is driven to rotate so that rays of red, green and blue light are sequentially projected on to the display device 155, rays of red, green and blue light that are emitted sequentially from the display device 155 are projected by the group of projection system lenses, and the various fans such as an intake fan 127 and the exhaust fan 125 are driven to start cooling the interior of the projector housing.

In addition, a posture adjustment of the projector housing which is carried out to match the projecting direction by the group of projection system lenses to the projection screen is carried out by adjusting the protruding height of the front leg 131 in such a state that the rays of red, green and blue light are being projected by the group of projection system lenses.

When no image signal or video signal is inputted from a personal computer, rays of red, green and blue light are sequentially emitted from the whole of a display area of the display device 155, and the rays of light are projected by the group of projection system lenses. Because of this, the projection area on the projection screen becomes white over the whole area thereof.

Then, when an image signal or video signal is inputted, single-colored image data of red, green and blue is sequentially written on to the display device 155, and three single-colored images of red, green and blue are then sequentially projected on to the projection screen so that a full-color image is displayed thereon.

In addition, after the projection of images is completed, the projection lens cover 115 only has to be closed with the input of an image signal or video signal stopped and the power supply key switched off. When the power supply key 101 is switched off, the light emitting elements 11 of the light source apparatuses 40 are switched off, and the driving and rotating of the color wheel 141 is stopped. After a certain predetermined time has elapsed, the driving of the intake fan 127 and the exhaust fan 125 is then stopped.

Note that while in the projector 100, light emitted from the light source apparatuses 40 is converted into rays of red, green and blue light by the color wheel 141 so as to be shone on to the display device 155, when a configuration is adopted in which a light source apparatus 40 which utilizes only red light emitting diodes, a light source apparatus 40 which utilizes only green light emitting diodes and a light source apparatus 40 which utilizes only blue light emitting diodes are used and optical axes of these light source apparatuses 40 are made to coincide with each other so that rays of light emitted, respectively, from the individual light source apparatuses 40 are superposed on each other by the dichroic prism 70, rays of red, green and blue light are directly shone on to the display device 155 from the light source apparatuses 40, respectively, without using the color wheel 141 so as to provided a full-color image.

Note that while the video projector 100 utilizes the three light source apparatuses 40 as the light source apparatus 40, only one light source apparatus 40 can, of course, be used as a light source for a small-sized projector.

Thus, with the projector of the embodiment, by utilizing the aforesaid light source apparatus 40, the light source apparatus 40 can be made small in size, whereby a projector main body can also be made small in size. In addition, since the light emitting diodes are used, a reduction in the temperature inside the housing can also be realized.

Note that the invention is not limited to the embodiments that have been described heretofore, and hence the invention can be modified and improved freely without departing from the spirit and scope of the invention. Furthermore, the light source apparatus of the invention can be applied to not only projectors but also other electrical appliances and illuminating appliances.

What is claimed is:

1. A light source unit comprising:
a light emitting element;
a substrate on which the light emitting element is disposed;
a sealing portion which transmits light of the light emitting element; and
a collimator lens for forming light emitted from the sealing portion into a bundle of parallel rays of light for emission therefrom,
wherein the sealing portion has two or more convexly curved surfaces which project in a direction in which light is emitted therefrom,
wherein the collimator lens has an inverted truncated hexagonal pyramid shape, and
wherein a light emitting surface of the collimator lens comprises a flat surface portion which is formed at a center thereof in such a manner as to be parallel to a bottom surface of the collimator lens, and an inclined surface formed around a perimeter of the flat surface portion, whereby the collimator lens comprises an inverted truncated hexagonal cone-shaped top portion which is recessed at a center thereof.

2. The light source unit according to claim 1, wherein the sealing portion is formed into a shape of a body of revolution.

3. The light source unit according to claim 1, wherein the sealing portion comprises a dome-shaped sealing material and a lens cap, and
wherein the lens cap has a shape of a body of revolution having two or more convexly curved surfaces which project in a direction in which light is emitted therefrom, has an opening portion for accommodating therein the sealing material in a bottom portion thereof, and is bonded to the sealing material at the opening portion thereof.

4. A light source apparatus comprising:
a plurality of light source units which are disposed adjacent to each other, the plurality of light source units each comprising a light emitting element, a substrate on which the light emitting element is disposed, a sealing portion which transmits light of the light emitting element, and a collimator lens which forms light emitted from the sealing portion into a bundle of parallel rays of light for emission therefrom,
wherein the sealing portions each have two or more convexly curved surfaces which project in a direction in which light is emitted therefrom,
wherein the collimator lens is formed into an inverted truncated hexagonal pyramid shape, and
wherein a light emitting surface of the collimator lens comprises a flat surface portion which is formed at a center thereof in such a manner as to be parallel to a bottom surface of the collimator lens, and an inclined surface formed around a perimeter of the flat surface portion, whereby the collimator lens comprises an inverted truncated hexagonal cone-shaped top portion which is recessed at a center thereof.

5. The light source apparatus according to claim 4, wherein the sealing portion is formed into a shape of a body of revolution.

6. The light source apparatus according to claim 4, wherein the sealing portion comprises a dome-shaped sealing material and a lens cap, and
wherein the lens cap has a shape of a body of revolution having two or more convexly curved surfaces which project in a direction in which light is emitted therefrom, has an opening portion for accommodating therein the sealing material in a bottom portion thereof, and is bonded to the sealing material at the opening portion thereof.

* * * * *